United States Patent [19]

Eisele et al.

[11] 3,921,201

[45] Nov. 18, 1975

[54] IMPROVED LIQUID COOLED SEMICONDUCTOR DISK ARRANGEMENT

[75] Inventors: Max Eisele, Erlangen; Günter Wilhelm, Wiesenthau, both of Germany

[73] Assignee: Siemens Aktiengesellschaft, Munich, Germany

[22] Filed: July 15, 1974

[21] Appl. No.: 488,835

Related U.S. Application Data

[63] Continuation of Ser. No. 324,796, Jan. 18, 1973, abandoned.

[30] Foreign Application Priority Data

Jan. 22, 1972 Germany ........................... 2203032

[52] U.S. Cl. ........................ 357/82; 357/76; 165/80

[51] Int. Cl.$^2$ ........................................... H01L 25/04

[58] Field of Search .................. 357/72, 77, 82, 76; 165/80, 105

[56] References Cited

UNITED STATES PATENTS

| | | | |
|---|---|---|---|
| 2,915,685 | 12/1959 | Diebold | 357/82 |
| 3,486,083 | 12/1969 | Shunsuke | 357/76 |
| 3,502,956 | 3/1970 | Fries et al. | 357/76 |
| 3,506,889 | 4/1970 | Vogt | 357/76 |
| 3,573,574 | 4/1971 | Davis | 357/82 |
| 3,643,131 | 2/1972 | Scherbaum | 357/82 |
| 3,668,506 | 6/1972 | Beasley et al. | 357/82 |
| 3,703,668 | 11/1972 | Bylund et al. | 357/82 |
| 3,715,632 | 2/1973 | Warburton | 357/82 |
| 3,763,402 | 10/1973 | Shore et al. | 357/82 |

*Primary Examiner*—Andrew J. James
*Attorney, Agent, or Firm*—Kenyon & Kenyon Reilly Carr & Chapin

[57] ABSTRACT

Semiconductors in the form of disks having contact ends are positioned side-by-side between electrically conductive flat plates spanning the ends of at least two of the disks and contacting and pressing against these ends. One of the plates may be formed by conductive sections structurally interconnected by electrical insulation with each section spanning the ends of groups of the disks and electrically interconnecting these ends, and an opposite one of the plates may then contact the other ends of all of a plurality of such groups and be electrically conductive throughout, permitting operation of the semiconductors as branches of rectifier or converter circuits and the like. One or both of the plates may be cooled by a flow of liquid coolant in thermally conductive connection with one or another of the plate's surfaces. By using an electrically non-conductive coolant, such as oil, short-circuiting of the sections interconnected by the electrical insulation is avoided when the plate having these sections is contacted throughout its length by the coolant.

8 Claims, 12 Drawing Figures

IMPROVED LIQUID COOLED SEMICONDUCTOR DISK ARRANGEMENT

This is a continuation of application Ser. No. 324,796 filed Jan. 18, 1973, now abandoned.

BACKGROUND OF THE INVENTION

Semiconductor arrangements, particularly when relatively high electric power is involved, are used in both parallel and series connected electrical interconnection, with each semiconductor in the form of a disk having opposite contact ends. Electrical connections are made by these ends being positioned between contactor members which press against the disk's ends. This is both to establish electrical connections with these ends and by firm contact therewith to remove heat from the ends by conduction, the contactor members being either air or liquid cooled.

Such semiconductors, in the form of disks as described hereinabove, have been stacked one on top of the other in axial alignment with liquid-cooled capsules interposed between each two disks, producing a column of parts which are clamped together by tension bolts. Thus, each disk is clamped between two capsules, the latter functioning both as electrical contactors and cooling means.

The above arrangement has the disadvantages in that the piping required to conduct the cooling liquid to the multiplicity of capsules is complicated, this applying also to the electric wiring leading to and from each capsule so that the disks may be electrically connected in series, in parallel, in groups of such connections, or otherwise as required. These connections, both liquid and electrical, are expensive to install, involve possible operational trouble and produce overall arrangements of substantial physical bulk.

The above applies to converters, to rectifiers, and in general whenever a multiplicity of such semiconductors must be electrically interconnected, both in parallel and series circuits or in combinations of these, and which handle electrical power of a degree requiring the dissipation of substantial amounts of heat.

SUMMARY OF THE INVENTION

An object of the present invention is to provide a semiconductor arrangement which represents a substantial improvement on the above described type in all respects, and particularly so that the arrangement is made substantially more compact and with the necessary electrical connections and coolant plumbing simplified while affecting substantial reduction in the weight of such arrangements.

According to the present invention, this object is attained by positioning the disks side-by-side with the contactor members which press against the disks' contact ends provided by electrically conductive flat plates spanning the ends of at least two of the disks and contacting the pressing on these ends. At least one of these plates is formed by sections structurally interconnected by electrical insulation, each section spanning the ends of two or more of the disks' ends and electrically interconnecting these ends. Thus all the ends of a plurality of groups of side-by-side semiconductor disks may be electrically interconnected together while the other ends of these disks may be electrically interconnected as to each of the groups only, all as required by the circuitry involved.

With this arrangement the semiconductor disks are clamped between the flat plates with the plates themselves functioning both as structural mounting means and to provide the necessary electrical interconnections so that complicated external wiring is unnecessary.

Furthermore, because the plates are firmly pressed against the contact ends of the semiconductor disks, there is not only good electrical interconnection but good thermal conduction connection as well. Therefore, by flowing a liquid coolant through or over a surface of one or another of the contactor plates, the heat received by the latter from the semiconductors may be carried away by the coolant. To avoid short-circuiting the plate sections electrically insulated from each other, the liquid coolant may be electrically non-conductive; for example, transformer oil may be used.

These semiconductor disks are often required in connection with circuitry associated with electrical equipment such as transformers and the like. The casing of this type of equipment usually has a flat metal outside surface and this surface may be used as one of the plate contactors to interconnect the ends of a multiplicity of the semiconductor disks, the other of the plates which would then ordinarily be the one with the sections insulated from each other, being clamped against this side of the casing, resulting in an extremely compact assembly.

One or both of any two opposite ones of the plate contactors clamping the semiconductor disks between them may be made with coolant passages and the liquid coolant conducted internally therethrough. Alternately, or in conjunction with such an arrangement, this coolant may be conducted between two opposing plates and directly around and over the semiconductor disks clamped between these plates, this producing the most direct possible cooling. As previously stated, the coolant may be electrically non-conductive to avoid short-circuiting.

When the heat absorbed by the liquid coolant is adequate to cause the coolant to vaporize, increased cooling is effected because of the vaporizing action.

BRIEF DESCRIPTION OF THE DRAWINGS

Preferred embodiments of the present invention are illustrated schematically by the drawings in which.

DESCRIPTION OF THE PREFERRED EMBODIMENTS

Figure 1A:
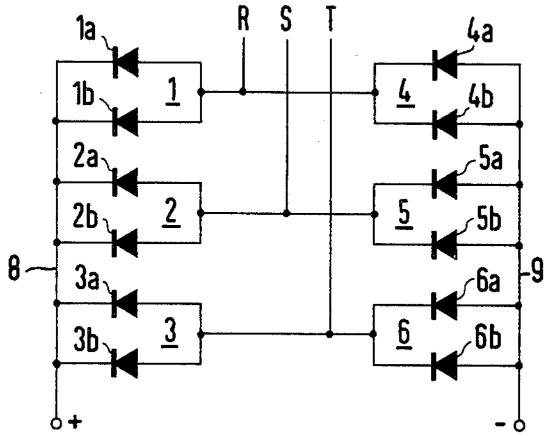
FIG. 1*a* is a diagram of a typical rectifier bridge circuit using two parallel connected semiconductor diodes of the disk type for each bridge branch.

The rectifier bridge circuit shown in FIG. 1*a* contains two parallel connected semiconductor diodes in each of the branches 1 to 6 of the circuit, so that as to each branch, the diodes 1*a* and 1*b*, 2*a* and 2*b*, etc. throughout the branches 1 through 6 are connected in parallel. The three-phase AC current is connected via the lines R, S and T, the DC output being as indicated by the plus and minus signs.

The semiconductors are in the form of the disks previously mentioned and it can be seen that if they are stacked coaxially one on top of the other, with interposed liquid cooled combination contactor and cooling elements between each, that external wiring, plumbing and the like involve substantial bulk and weight, this being undesirable.

Figure 1B:
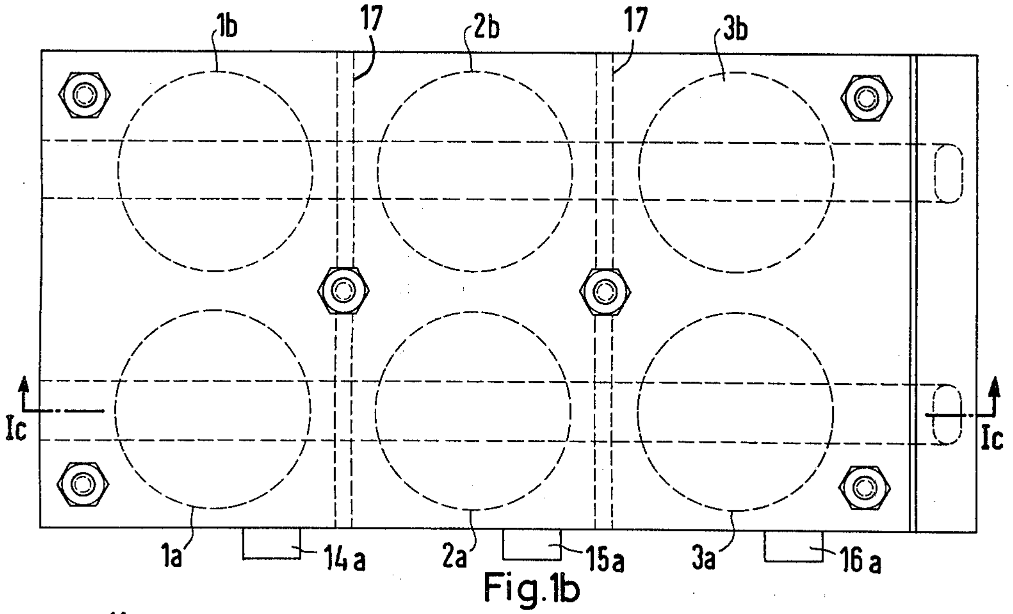
FIG. 1*b* is a top view of an arrangement enbodying the principles of the present invention.
Figure 1C:
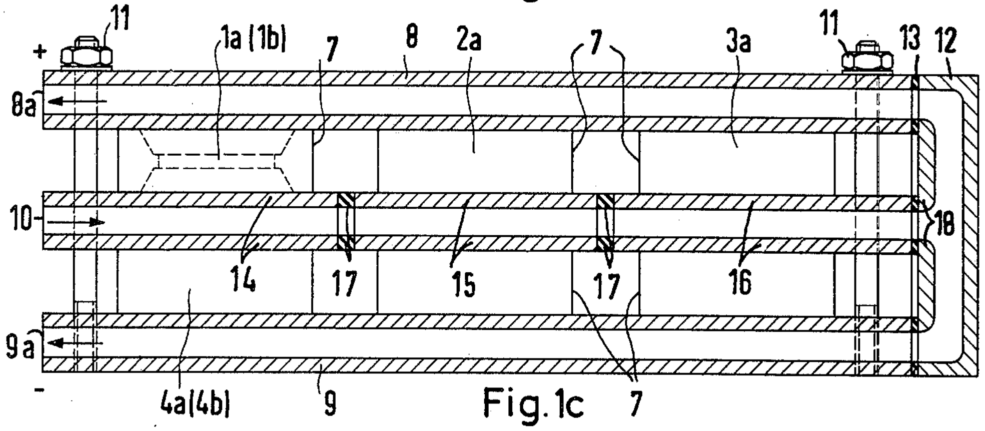
FIG. 1*c* is a cross section taken on the line 1*c*—1*c* in FIG. 1*b*.

According to the present invention, as shown by FIGS. 1*b* and 1*c*, in this instance each semiconductor is encased by a housing 7 which is itself a disk, although thicker than the semiconductor itself. In FIG. 1c broken lines indicate the parts inside of each of the housing disks 7. Semiconductors are available both housed in the fashion shown and without such a housing, or in other words, being in the form of a thinner disk. In all cases the disks have ends forming contacts both for establishing electrical connections and for contact with heatsinks, cooling elements and the like.

As shown in FIGS. 1*b* and 1*c*, the disks 7 are arranged as pairs of side-by-side disks, each pair forming one of the branches 1, 2, 3, etc., and to obtain maximum compactness, there are two layers of these pairs one on top of the other. This does not involve the long columns of the prior art.

Looking at FIGS. 1*c*, it can be seen that the two levels of disks are clamped between flat contactor plates 8 and 9, with an intermediate plate 10 separating the two levels, all of the plates being clamped together by electrically insulating tension bolts 11. All of the plates are formed with liquid coolant passages, being opened at their left-hand ends for connection with piping, while their right-hand ends are interconnected by a manifold plate 12 which is electrically isolated via electrical insulation 13. As indicated by the arrows, the liquid coolant enters the intermediate plate 10 via the manifold plate 12 flows through the two outermost plates 8 and 9 and out of their open ends, thus effecting good cooling and simplifying the necessary plumbing.

As shown, the plates 8 and 9 are electrically conductive throughout, the plate 8 serving to connect together the outputs of the branches 1, 2 and 3 in FIG. 1*a*, and the plate 9 doing the same for the branches 4, 5 and 6. For the input connections, the plate 10 is divided into three sections 14, 15 and 16, structurally combined but electrically separated from each other by insulation 17. The spaces between the plates are isolated from the flow of liquid coolant by electrically insulated plates 18 in each instance. The insulated sections of the plate 10 are transversely continuous as shown by FIG. 1*b*. Thus, the section 14 can be connected to the AC line R, the section 15 to the line S and the section 16 to the line T. This is done via connector tabs 14*a*, 15*a* and 16*a* which extend from the sandwich formed by the various parts described.

It can be seen that in effect a single package or unit is formed with all of the semiconductor diodes clamped firmly in position by the contactor plates which function both as electrical contactors and liquid-cooled heatsinks. Assuming the two liquid coolant outlets 8*a* and 9*a* are interconnected only two liquid coolant pipe connections need be made for the coolant and only three electrical connections for the electrical input, the plates 8 and 9 themselves directly carrying the DC output and requiring connection with only two wires.

If the twelve semiconductor diode disks are stacked on top of each other, in axial alignment to form a column with the necessary interposed liquid cooled contactors between each, the resulting complexity of plumbing and wiring is easily understandable, making the contrast between that old arrangement and that of the present invention very plain.

As indicated by FIGS. 1*b* and 1*c*, the disks 1*a* and 1*b* of the circuit branch 1 are positioned directly above the disks 4*a* and 4*b* of the branch 4, both branches 1 and 4 being connected to the same AC voltage of the line R. This is advantageous because it makes connection of the section 14, via its terminal member 14*a*, easier and simpler. This same arrangement applies with respect to the branches 2 and 5 and 3 and 6.

Since the liquid coolant enters through the intermediate plate 10, with its various electrically insulted sections 14, 15 and 16, it can be appreciated that the liquid coolant must be electrically non-conductive as exemplified by transformer oil. In this embodiment just described the plate surfaces which engage the contact ends of the housings 7 of the various semiconductor disks should be machine finished with relatively small tolerances from precision flats, and the fastenings 11 must be judiciously tightened, all for the purpose of making the intercontacting surfaces of the plates and semiconductor housings as parallel to each other as possible and under uniform pressure throughout.

Figure 2A:
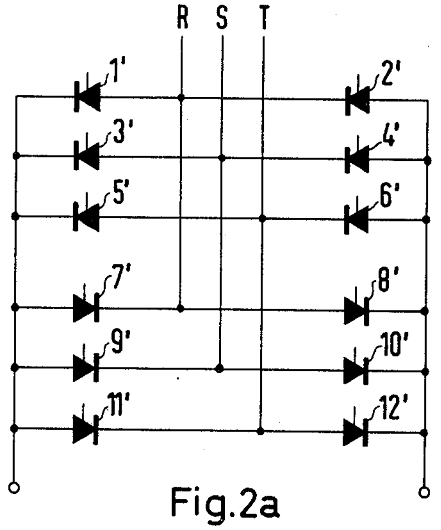
FIG. 2*a* is a diagram showing the semiconductors in a converter circuit.

With the above in mind, another embodiment of the invention is shown as it can be applied to a converter circuit such as is shown in FIG. 2*a*.

In this case twelve semiconductor elements 1' to 12' are involved, these being thyristors since a converter is involved. Also, in this instance a solution of the problem of maintaining parallel contact between the plates and the disk contact ends is involved, this being an arrangement eliminating the requirement for complete parallelism between the plates and the semiconductor disks' contact ends.

Figure 2B:
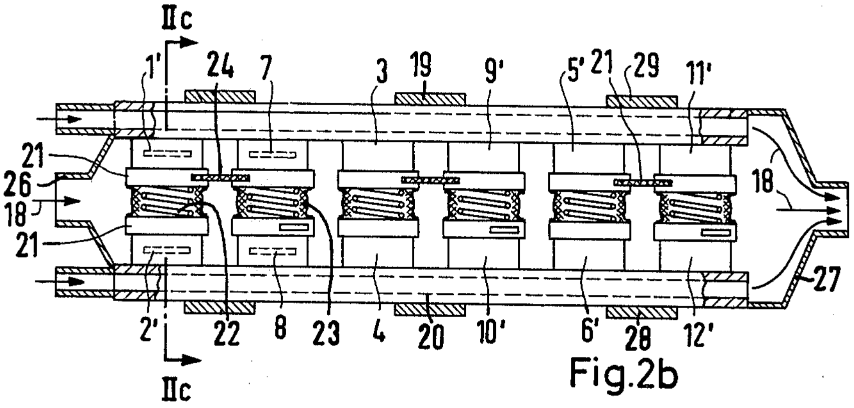
FIG. 2*b* is a longitudinal section of an arrangement suitable for this converter and embodying the present invention.
Figure 2C:
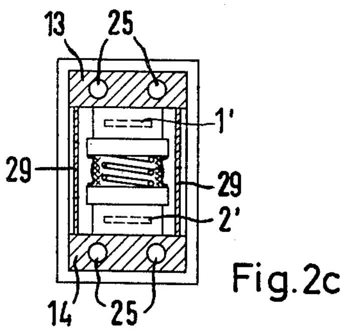
FIG. 2*c* is a cross section taken on the line 2*c*—2*c* in FIG. 2*b*.

Thus, as shown in FIGS. 2*b* and 2*c*, the semiconductor disks, using the housings as described before, are positioned between only two of the plates. Each of the plates is electrically isolated from the other and functions to connect the appropriate ends of the semiconductor disks in the manner shown by FIG. 2*a*. The disks are mounted in pairs which each comprise two of the disks arranged in axial alignment with each other with their appropriate ends contacting the contactor plates 19 and 20 respectively. As to each pair, their contact ends opposite to those contacting the contactor plates 19 and 20 are engaged by contactor members 21 pressed apart by compression coil springs 22, this pressing the contactor members 21 against the ends of the semiconductor disks opposite to their ends contacting the plates 19 and 20 respectively, and providing for film electrical contact. As required by the circuitry of FIG. 2*a*, the opposing ends of each pair of semiconductor disks are interconnected by the spring 22 being encircled by an electrically conductive fabric tube 23. Also as required by the circuitry of FIG. 2*a*, the members 21 are interconnected as required, by flexible conductors 24. Each of the plates 19 and 20 may be provided with liquid coolant passages 25. In addition, the space between the insides of the two plates 19 and 20 may be provided with a fluid entrance 26 and an outlet 27 so that a liquid coolant, of electrically non-conductive type, may be passed through the space between the two plates as well as through the passages 25 of the two plates.

It can be seen that a sandwich construction is again produced, the parts being held together by compression bands 28.

The fluid flow around the semiconductor disks is confined by side walls 29, which may also be used in the first example, to make the entrance and exit 26 and 27 respectively, effective. The exit 27 may function also as a manifold for the passages 25 formed in the two plates.

With this construction, the various flexible conductors 24 serve as connections for the AC line comprising the three wires R, S and T, while the two plates function to connect the outputs of the thyristors 1′ to 12′, respectively, to the output terminals required by the circuitry of FIG. 2*a*.

It is important to note that in this instance each of the semiconductor disks is engaged on one of its contact surfaces by the member 21 which is disk-like and capable of universal motion, so that with the action of the spring 22 as to each axially aligned pair of the semiconductor disks, the members 21 can seek parallel relationship with the contact surfaces of the two disks. On the other hand, the disk surface which contacts one or the other of the two plates 19 and 20 is of small area and can itself seek a parallel relationship with the disk involved. In this way precision machining of the surfaces of the two plates throughout their entire areas is made unnecessary.

Although not previously mentioned, it is apparent that the inlet and outlet 27 previously described and the walls 29, all of which serve as conduits or confinements for the electrically non-conductive liquid coolant, should themselves be made of electrically insulating material.

Figure 3A:
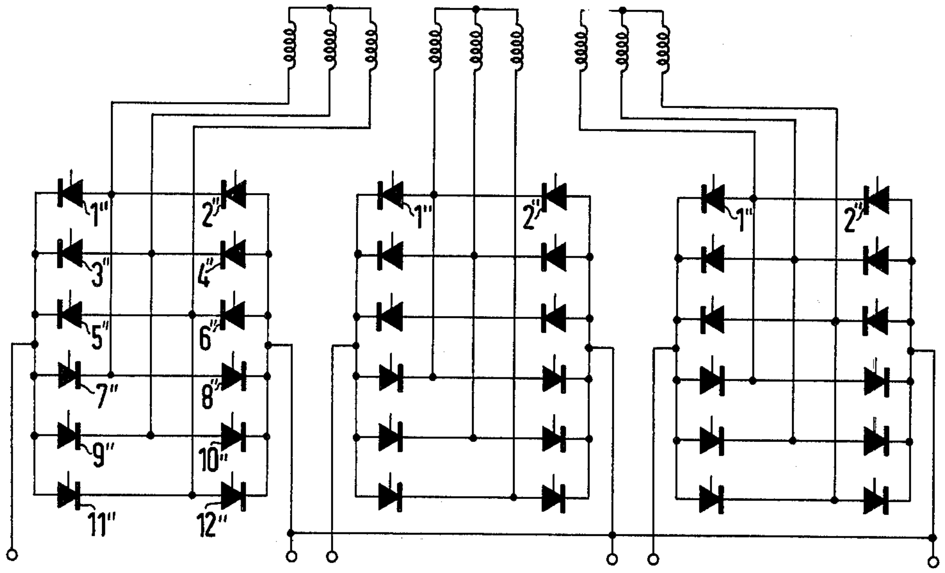
FIG. 3*a* shows a cycloconverter circuit diagram.

A cycloconverter circuit arrangement is shown by the diagram of FIG. 3*a*, in which instance 26 thyristors are involved, this emphasizing the desirability of avoiding the need for great parallelism between the two contactor plates and the semiconductor end contacts previously described.

In this instance the same elements previously described are substantially duplicated excepting for the differences required for the cycloconverter circuitry.

In this instance neither of the plates 19′ and 20′ are provided with liquid cooling. However, as shown, the upper one of the plates 19′ is shown as provided with cooling fins 19″. These alone may be sufficient, the side walls 29′ being in this case primarily protection against contamination. As suggested by broken lines in FIG. 3*c*, these end walls 29′ may be removed and appropriate connections 26′ and 27′ may be provided, along the lines as shown in FIG. 2*b*.

Another difference in this instance is that because of the requirements of the cycloconverter circuitry, the upper plate 19′ may be formed as three sections structurally interconnected by electrically insulating material 17′ to achieve the circuitry connections required in this instance.

Figure 3B:
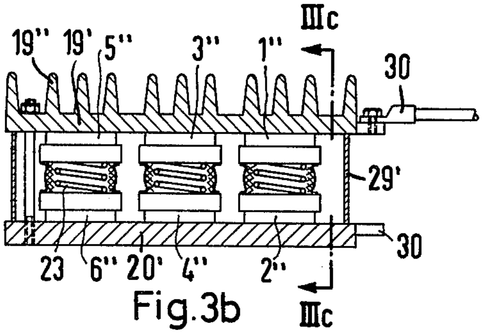
FIG. 3*b* shows a cross section of an embodiment of the present invention suitable for the semiconductors shown in FIG. 3*a*.
Figure 3C:
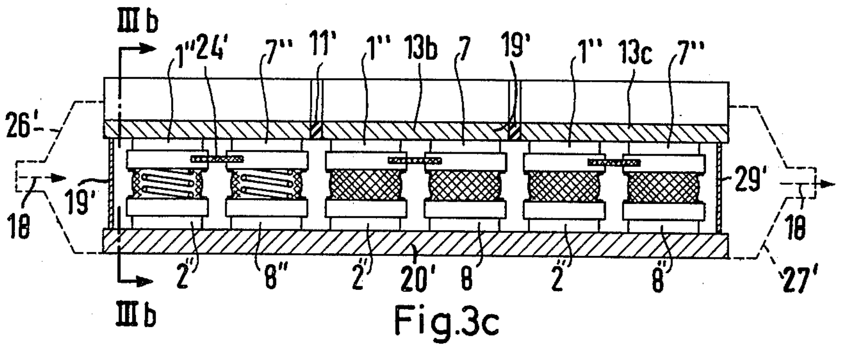
FIG. 3*c* is a longitudinal section taken on the line 3*c*—3*c* in FIG. 3*b*, the latter being taken on the line 3*b*—3*b* in this FIG. 3*c*.

One difference that should be noted in FIGS. 3*b* and 3*c* is that the semiconductor disks are not closed by the housings 7 as shown in the case of the first and second embodiments. The semiconductor disks are completely exposed as shown in FIGS. 3*b* and 3*c*. This provides an extremely efficient heat exchange as the liquid coolant is passed between the plates 19′ and 20′ and if the temperature rise is adequate the coolant, such as transformer oil, may vaporize this providing an extremely efficient cooling effect for the various semiconductor disks.

In this example shown by FIGS. 3*a* through 3*c*, as required by the circuitry of 3*a*, the contact members are interconnected by flexible conductors 24′ as referred to in connection with the second embodiment. Terminals 30 may be provided as required and as indicated in FIG. 3*b*.

Figure 4A:
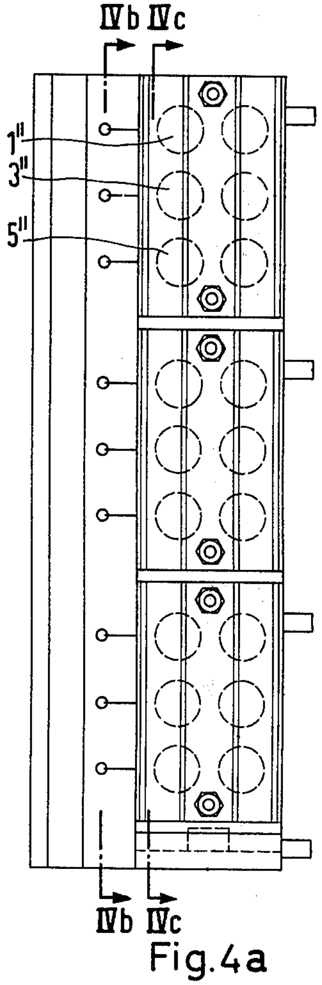
FIG. 4*a* is a front view of a transformer to which an arrangement of the present invention is applied.
Figure 4B:
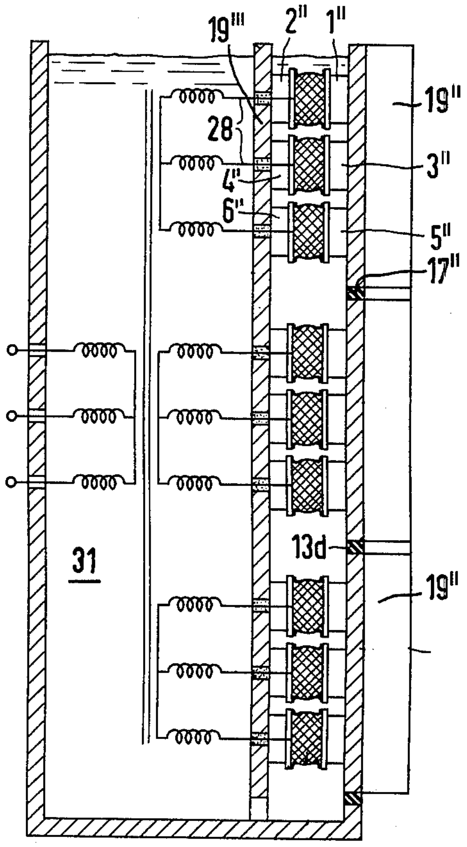
FIG. 4*b* is a composite section taken on the lines 4*b*—4*b* in FIG. 4*a;*.

In FIGS. 4*a* and 4*b* a construction is shown wherein the need for a separate one of the plates, such as 19 or 19′ in FIGS. 2*b* and 3*b*, for example, is eliminated. In this case a transformer, generally indicated at 31, is associated with a bank of the semiconductor disks, such as in circuitry as required for a converter. In this instance the main difference over the need for the plate contactor shown at 8 in FIG. 1*c* and at 19 as shown in FIG. 2*b*, or at 19′ as shown in FIG. 3*c*, the corresponding plate, indicated at 19‴ is provided by a flat side of the transformer casing of the transformer 31. In this instance the segmented electrically insulated plate, required for the circuitry involved, is provided with the fins 19″ as indicated in FIGS. 3*b* and 3*c*. Also, the contactor plate 17″ in this instance has the insulation previously described.

It can be seen that in this instance one of the contactor plates used to form the very compact arrangement of the present invention is formed by the side of the equipment with which the semiconductor system is used. In some instances it may be desirable not to integrate the system with the transformer casing as suggested in the forms of FIGS. 4*a* and 4*b*, but instead, to have it as a separate detachable unit.

Figure 4C:
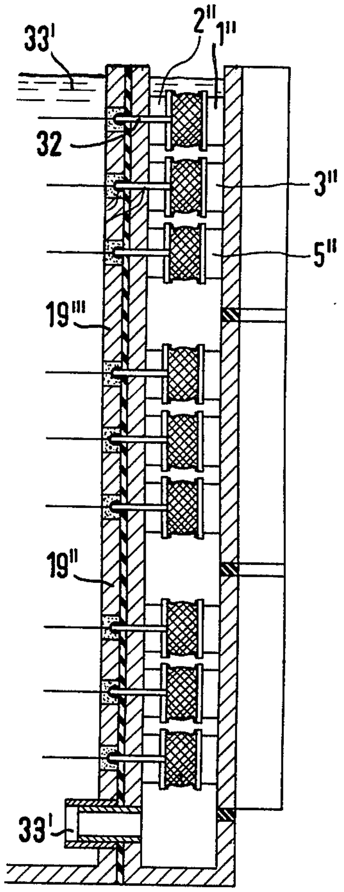
FIG. 4*c* shows an example of the invention in the form of an arrangement that may be detachably connected to a transformer.

The above concept is illustrated by FIG. 4*c* wherein the necessary contacts from the various semiconductor disk units is transmitted into the transformer casing flat side 19‴ via separable interconnectors 32 with, if desired, liquid cooling being provided by separable conductor units 33 and 33′ which connect with the transformer oil normally inside of the transformer having the side 19‴ with which the sandwich construction of the present invention is associated.

It can be understood from the foregoing that the concept of the present invention is essentially that of avoiding the plumbing and electrical connection intricacies of the prior art by arranging the semiconductor disk-like elements side-by-side between two contactor plates which are clamped together to press against the elements therebetween and to thus form a unit which is relatively self-contained. One of the plates may actually be the side of electrical equipment such as a transformer with which the semiconductors are associated as required by the circuitry requiring the use of the semiconductors. The semiconductors arranged side-by-side may comprise groups either one on top of the other or normally which extend laterally from each other. As required for the circuitry the plates may be formed by various sections structurally interrupted by electrical insulation or the plates may be electrically continuous. For cooling a liquid coolant, particularly one of an electrically non-conductive oil, may be passed directly over the semiconductors or through passages formed in the plates, and with the coolant being electrically non-conductive, it may be passed over plates comprising electrically insulated sections. The semiconductor element disks may be used in disk-like housings or left exposed. When exposed, the electrically non-conductive coolant may be passed directly around the semiconductors. In all cases there is the advantage that the plates themselves form all or substantially all of the electrical connections required with the contact ends of the semiconductors which must be interconnected and are interconnected by the plates, thus avoiding electrical connection complications. As to plumbing only a very few simple connections are required either for connection to plates having liquid coolant passages or to pass the coolant between the plates and directly around the semiconductors. As to the semiconductors clamped between the plates, to avoid the need for precision finishing of the plates, the semiconductors may be mounted individually in axial alignmet as to pairs, with the springs pressing the pairs apart through the intermediary of small sized electrical contact members which are inherently self-aligning relative to the contact surfaces of the semiconductor disks.

What is claimed is:

1. A semiconductor arrangement, comprising: a plurality of semiconductor discs, each having ends forming contacts, disposed in a spaced-apart adjacent relationship;

a plurality of electrically conductive plates, disposed in space-apart parallel relationship in engagement with said discs and between which said discs are arranged, at least a pair of said plurality of semiconductor discs being disposed between said plates in an axially superimposed relationship;

a plurality of coil springs, disposed between said axially superimposed discs, for pressing said discs into engagement with said plates; and means, coupled to said plates, and including side walls interposed therebetween, for conducting a liquid coolant between said plates around said semiconductor discs.

2. The arrangement recited in claim 1, wherein at least one of said plates is formed by a plurality of sections which are structurally interconnected by electrical insulation, each of said plate sections being disposed so as to span the contacts of at least two adjacent semiconductor discs for electrically interconnecting said adjacent semiconductor contacts.

3. The arrangement recited in claim 2, wherein another one of said plates is formed by an electrical equipment casing, said semiconductor discs being electrically cooperative with said electrical equipment and being disposed in engagement with said casing.

4. The arrangement recited in claim 2, wherein each of the sections of said one of said plates spans the contacts of at least two adjacent ones of said semiconductor discs, and another of said plates, disposed opposite said one of said plates, spans all of the opposing contacts of said semiconductor discs, said another of said plates being electrically conductive throughout its axial length.

5. The arrangement recited in claim 1, further comprising a plurality of electrically conductive members disposed between and in engagement with said coil springs and said semiconductor discs.

6. The arrangement recited in claim 1, wherein a plurality of pairs of said discs are disposed in said axially superimposed arrangement so as to form a plurality of said superimposed arrangements between said plates, and further comprising a plurality of flexible electrical conductors, coupled to adjacent ones of said plurality of superimposed disc arrangements, for electrically interconnecting said adjacent disc arrangements.

7. The arrangement recited in claim 1, wherein said plates each include fluid passages extending axially therethrough for conducting a liquid coolant.

8. The arrangement recited in claim 1, wherein one of said plates comprises the flat side of an electrical transformer casing.

* * * * *

UNITED STATES PATENT AND TRADEMARK OFFICE
CERTIFICATE OF CORRECTION

PATENT NO. : 3 921 201

DATED : November 18, 1975

INVENTOR(S) : Max Eisele et al

It is certified that error appears in the above-identified patent and that said Letters Patent are hereby corrected as shown below:

In Column 4, line 31, change "insulted" to --insulated--

In column 5, line 2, change "film" to --firm--

In column 7, line 41, change "space-apart" to --spaced-apart--

Signed and Sealed this

*twenty-third* Day of *March 1976*

[SEAL]

*Attest:*

RUTH C. MASON
*Attesting Officer*

C. MARSHALL DANN
*Commissioner of Patents and Trademarks*